United States Patent [19]

Nelson et al.

[11] Patent Number: 4,754,260
[45] Date of Patent: Jun. 28, 1988

[54] METHOD OF AND APPARATUS FOR REDUCING QUANTIZING NOISE IN ANALOG TO DIGITAL CONVERTERS

[75] Inventors: Robert G. Nelson, Dallas; Thomas F. Crandell, Lancaster, both of Tex.

[73] Assignee: Timeback Systems, Inc., Dallas, Tex.

[21] Appl. No.: 78,289

[22] Filed: Jul. 27, 1987

Related U.S. Application Data

[63] Continuation-in-part of Ser. No. 2,513, Jan. 12, 1987, which is a continuation-in-part of Ser. No. 857,028, Apr. 29, 1986, Pat. No. 4,683,457, which is a continuation-in-part of Ser. No. 566,314, Dec. 28, 1983, Pat. No. 4,683,456.

[51] Int. Cl.$^4$ ............................................. H03M 1/06
[52] U.S. Cl. ...................... 340/347 AD; 340/347 CC
[58] Field of Search ...................... 324/83 R; 328/155; 340/347 AD, 347 M, 347 CC

[56] References Cited

U.S. PATENT DOCUMENTS 3,623,072  11/1971  Pohlman et al. ............ 340/347 AD Primary Examiner—William M. Shoop, Jr.
Assistant Examiner—Richard K. Blum
Attorney, Agent, or Firm—Kanz, Scherback & Timmons

[57] ABSTRACT

A system with improved signal-to-noise ratio for digitizing a representation of an analog condition comprises two oscillators for generating high frequency digital pulse signals, the frequencies of which are harmonically related one to the other. One of the oscillators responds to the analog condition to cause a shift in phase in its digital signal to cause phase differences between the digital pulse signals. The phase differences include quantizing errors having energy from D.C. to one half the frequency of said digital signals. A phase detector detects the phase differences. The detected phase differences are applied to a low-pass filter to produce a signal representative of phase error in a frequency band of interest. A phase modulator modulates the phase shifted digital signal in response to said signal representative of phase error to enhance the phase difference in said frequency band of interest. The phase modulated digital signal is compared with the other digital signal by a D flipflop to obtain a measure of the phase shift. The measure of the phase shift utilized to adjust the phase of the digital pulse signals toward an in-phase condition.

13 Claims, 1 Drawing Sheet

METHOD OF AND APPARATUS FOR REDUCING QUANTIZING NOISE IN ANALOG TO DIGITAL CONVERTERS

RELATED APPLICATIONS

This application is a continuation-in-part of application Ser. No. 002,513 filed Jan. 12, 1987, which is a continuation-in-part of application Ser. No. 857,028 filed Apr. 29, 1986, now U.S. Pat. No. 4,683,457, which in turn is a continuation-in-part of application Ser. No. 566,314 filed Dec. 28, 1983 now U.S. Pat. No. 4,683,456.

FIELD OF THE INVENTION

The present invention relates to improving the signal-to-noise ratio (SNR) of analog to digital converters, and more particularly to methods and apparatus for enhancing the SNR of analog to digital converters by reducing the effect of quantizing noise in the frequency band of interest.

BACKGROUND OF THE INVENTION

Analog to digital converters, also referred to as encoders, are commonly designed with a feature known as second order integration to improve the signal to noise ratio of the encoders, particularly of the over-sampled type. One common form of an over-sampled encoder is a delta-modulator in which the level difference between an input signal and a reconstruction of that input is measured with a voltage comparator to produce a digital output. This output is fed back to the reconstruction circuit, normally an integrator, to create a signal to match the input. The level difference between the input and the reconstruction of the input is known as the quantizing error or noise.

The quantizing error is a noise component which has frequency contributions from DC to one-half the sampling frequency. With delta-modulators, the sampling frequency is often one to three orders of magnitude above the highest frequency of interest. For example, for telephone voice encoding, the frequency band of interest might be 300 hertz to 3,000 hertz, while the sampling rate is 512,000 hertz. The quantizing error that occurs in the band of interest is undesirable because it reduces the usable dynamic range and hence affects the SNR. This quantizing error can be reduced in the band of interest by using second or higher order integration.

Higher order integration reshape the spectrum of the quantizing error signal by filtering and attenuating those spectral components that occur above the band of interest so that the voltage comparator will measure level differences between the input and the band of interest frequency components of the reconstruction signal. The voltage comparator's sampled output, the digital bits, will have a more accurate measure of the then quantized errors in the band of interest and will therefore have a higher SNR in the band of interest.

Many variations of the process used in higher order integration are employed in the art. For example, one variation is described in U.S. Pat. No. 4,509,037. The encoder described in that patent employs a spectrum tilter, a one bit analog to digital converter, a sampling circuit, and an internal decoder. An analog input signal and an internal analog signal from the internal encoder are summed to provide an analog dither, which is essentially an internal error signal. The analog dither signal is tilted by the spectrum tilter and is provided to the one bit analog to digital converter which generates a digital signal. The sampling circuit receives a digital signal from the analog to digital converter and generates a digital output which is fed back to the internal decoder. The spectrum tilter comprises at least three integrator circuits and a clipping circuit connected in parallel to two of the three integrator circuits. The three integrator circuits tilt the frequency spectrum of noise above the maximum frequency of interest and the clipping circuit prevents the encoder from becoming unstable.

The level difference techniques described in the prior art are not applicable to a new class of analog to digital converters or encoders as represented by co-pending application Ser. No. 566,314 filed Dec. 28, 1983 now U.S. Pat. No. 4,683,456 of which the present application is a continuation-in-part. The analog to digital converter described in the foregoing application utilizes phase shift principles in the generation of digital bits. More particularly, two high-frequency digital signals are generated with the average frequency of each signal being constant and the frequencies bearing a harmonic relationship one to the other. A representation of an analog condition is applied to cause a shift in phase in at least one of the digital signals. The digital signals are then compared to obtain a measure of the phase shift which is utilized to adjust the phase of the phase shifted signal toward its original phase condition. As a result of the measure of phase shift, there is generated a digital function which is representative of the amplitude of the adjustment utilized to return the phase shifted signal toward its original phase condition. Like the level differences described in the prior art, the phase differences of the analog to digital converter described above include quantizing errors which have frequency components in the frequency band of interest. Accordingly, in order to enhance the operation of the analog to digital converter above described, there arose a need to provide an entirely new approach to solve the problem of distortion introduced by quantizing noise or error.

SUMMARY OF THE INVENTION

The present invention is directed to a method for reducing the effect of quantizing error in an analog to digital converter of the type wherein two high-frequency digital pulse signals, the frequencies of which are harmonically related one to the other, are generated with two means, each independent of the other. A representation of an analog condition is applied to at least one of the generating means to cause a shift in phase in at least one of the digital signals to cause phase differences between the digital pulse signals. Those phase differences include quantizing errors having energy from DC to one-half the frequency of the digital signals. The phase differences are detected and then filtered with a low pass filter to produce a signal representative of phase error in a frequency band of interest. One of the digital signals is phase modulated in response to that signal representative of phase error to enhance the phase difference in the frequency band of interest and the phase modulated digital signal is compared with the other digital signal to obtain a measure of the phase shift. That measure of phase shift is then utilized to adjust the phase of the digital pulse signals toward an in-phase condition.

Through phase detection, low pass filtering and phase modulation, there results a reduction in the high frequency phase error at the phase comparator so that the phase comparator will better encode the reconstructed phase differences in the band of interest and thereby improve the encoder SNR by lowering its effective quantizing noise.

The reduction in the effective quantizing error is carried out with a decision filter. In comparing phase differences, error is likely to occur when the phase differences are very small and therefore the comparator may be unable to determine whether the phase of one digital signal is leading or lagging the phase of the other digital signal giving rise to an error in the production of either a zero bit or a one bit. The present invention enhances the operation of the comparator by increasing the phase difference between the digital signals in those instances where the phase difference is very small. In other words, the phase difference is amplified to enhance the ability of the comparator in determining leading or lagging conditions between phase of the compared signals. This is accomplished by attenuating the quantizing noise contribution of frequencies outside the frequency band of interest and thus limiting the phase adjustment to account mostly for quantizing noise occurring within the frequency band of interest.

The decision filter comprises a phase detector whose output is applied to a low-pass filter for attenuating the effect of high frequency quantizing noise and thus produce a signal representative of phase error in a frequency band of interest. In the specifically described embodiment, the output of the low-pass filter is then utilized to phase modulate the signal that has been phase shifted in response to the analog condition and thereby enhance the phase difference between the phase shifted signal and a reference signal in the frequency band of interest. In a preferred embodiment, the phase is modulated with a variable delay network which affects the rise time of the phase shifted signal and thus further affects the phase of that signal to enhance the phase difference between the signals in the frequency band of interest as appearing at the phase comparator.

BRIEF DESCRIPTION OF THE DRAWING

The invention, with further features, aspects and advantages thereof, will be better understood from a consideration of the following detailed description in conjunction with the accompanying drawings illustrating the best mode currently known to the present inventors in the practice of the present invention.

DETAILED DESCRIPTION OF THE INVENTION

Figure 1:
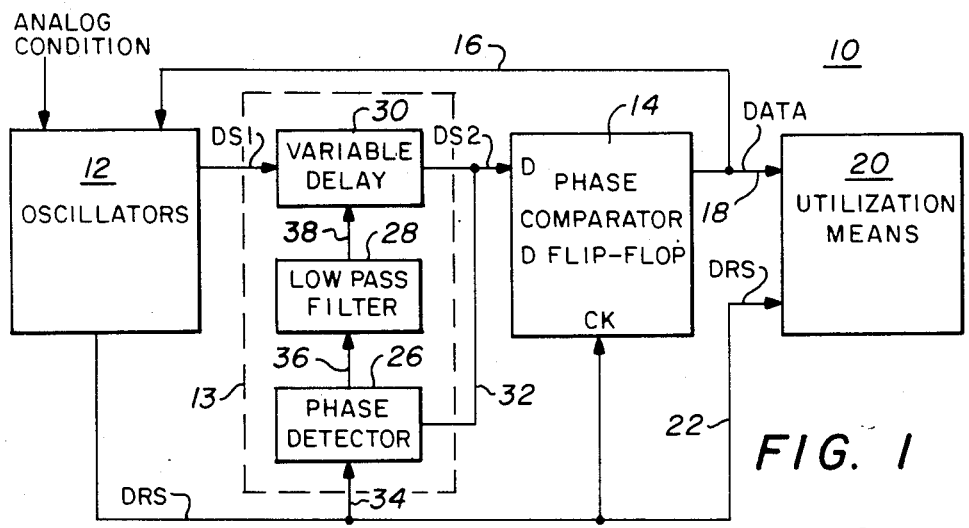
FIG. 1 is a block diagram of an analog to digital converter or encoder of the type described in the aforesaid pending application and including the decision filter of the present invention.

In the description which follows, like elements will be designated with the same reference characters throughout the various FIGURES. The method of the present invention includes the step of generating two high frequency signals, causing a shift in the phase of one of the two signals in response to an analog condition, comparing the phase of the signals and adjusting the phase of the phase-shifted signal toward an in-phase condition. More specifically, one of the digital signals is at a fixed frequency as may be produced by a clock. Since the phase differences, that is the phase differences between the clock pulses and the phase shifted signal include quantizing errors having energy from DC to one-half the frequency of the digital signals the method of the present invention includes the step of detecting phase differences between the signals prior to application of the signals to the phase comparator. The detected phase differences are filtered with a low pass filter to produce a signal representative of phase error in a frequency band of interest. One of the digital signals is then phase modulated in response to the signal representative phase error to enhance the phase difference between the two digital signals in the frequency band of interest. Thereafter, the phase modulated digital signal is compared with the other digital signal to obtain a measure of the phase shift. In the method described herein the phase shifted digital signal is phase modulated and then compared with the other digital signal, for example, a clock signal.

Further in accordance with one embodiment of the present invention, the input to the phase decision filter are the phase shifted digital signal and the clock signal. In another embodiment, the signals whose phase difference are measured will be the phase shifted signal at the output of the phase decision filter and the clock signal.

Referring now to FIG. 1, there is illustrated in block schematic form an analog to digital converter or encoder of the type fully described in the above-identified co-pending applications of which the present application is a continuation-in-part. The analog to digital converter 10 is shown comprised of two main elements: means to generate digital signals as represented by block 12 labeled oscillators, and a phase comparator D flipflop 14. The means to generate the digital signals includes two oscillators, one of which may be a clock whose output DRS is applied directly without alteration to the CK input of the phase comparator 14. The output of the other oscillator is responsive to the analog condition, e.g. temperature, weight, distance, velocity, etc., including signals whose frequencies are in the telecommunications range and higher to cause its phase to be shifted with respect to the output signal DRS from the clock. The output DS1 from the other oscillator is typically applied directly to the phase comparator 14 which measures the phase relationship between the digital signals DS1 and DRS and determines whether DS1 is early or late with respect to the digital reference signal DRS. The measure of that relationship is quantized at the Q output of the phase comparator flipflop 14 and this output, labeled DATA, is fed back over conductor 16 to adjust the phase of the other oscillator toward an in-phase relationship with the clock pulses or signal DRS. The DATA output is also applied via conductor 18 to a utilization means 20. The clock signal or pulses DRS are also applied to the utilization means 20 by way of conductor 22. The utilization means may include a low-pass digital filter to filter the digital output data to make it compatible with systems commonly employed to process the digital output.

The phase shift differences between signals DS1 and DRS include phase errors which are the result of quantizing errors which have frequency components in and beyond the frequency band of interest. These quantizing errors, more specifically, have energy from zero or DC to one-half the sampling frequency where the sampling frequency is the frequency of the clock and more particularly its output signal DRS. That energy consists of undesired coherent noise which has a negative effect upon the accuracy of the phase comparator D flipflop 14 in producing an accurate output labeled DATA.

In order to reduce the effect of the quantizing noise, a filter 13, designated a phase decision filter, is utilized to modify the relationship between the high frequency quantizing phase error as seen at the D flipflop 14 and the low frequency quantizing phase error. This can be accomplished by either attenuating the high frequency quantizing phase error or by amplifying the low frequency quantizing phase error. It is desired to have more gain in the low frequency phase errors than present in the high frequency phase errors so that the reconstruction, the data output, is a more accurate measure of the analog condition and this is accomplished by effectively eliminating the effect of the high frequency components of quantizing phase errors.

The phase decision filter 13 is comprised of a phase detector 26, a low pass filter 28, and a variable delay 30. The phase decision filter has as one input the phase shifted digital signal DS1 and as a second input the digital reference signal DRS. The output of the phase decision filter, the signal DS2, is applied to the D flipflop 14 after having been phase modulated by the filter 13. In the specific embodiment illustrated, the signal DS2 is applied by way of conductor 32 to one input of the phase detector 26. The other input to the phase detector is the digital reference signal DRS applied to the phase detector by way of conductor 34. The phase detector 26 may be provided by a digital gate such as a Texas Instruments 74HC86 exclusive OR gate. Other phase detectors are described by Floyd M. Gardner in his text "Phase Lock Techniques," second edition, 1979, John Wiley & Sons, pages 106–125. The output of the phase detector 26 is a digital signal whose time duration or width varies as a function of the phase difference between signals DS2 and DRS. The pulse width modulated signal produced by the phase detector 26 is applied by way of conductor 36 to the low-pass filter 28 resulting in an analog voltage output which is band limited by the low-pass filter and that signal or voltage is applied by way of conductor 38 to the variable delay 30 to control the amount of phase modification or shift applied to the signal DS1 to produce the output signal DS2. In summary, the phase difference between signals DS2 and DRS is detected, filtered, amplified and fed back in a positive feedback manner such that the low frequency phase error is amplified. The result is the appearance at the input of the phase comparator 14 of a low frequency phase error that is much larger and accordingly the phase comparator will be making decisions based on the low frequency phase error rather than on phase error that has been distorted by the presence of high frequency phase error. Accordingly, the phase comparator 14 is more capable of accurate quantizing in the production of the output data and the system is enabled more effectively to carry out the corrections necessary to adjust the signals DS1 and DRS toward an in-phase relationship.

Figure 2:
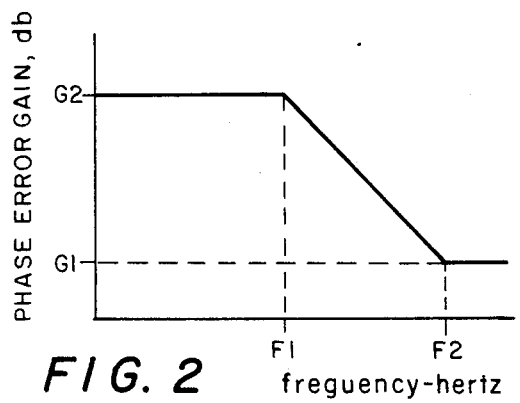
FIG. 2 is a graph depicting the frequency response of the phase decision filter of the present invention.

The graph of FIG. 2 is but one example of a suitable filter response. Plotted on a logarithmic scale along the ordinate is the phase error gain in db and frequency is plotted also on a logarithmic scale along the abscissa. The filter response at dc or zero frequency has a gain of G2. This gain is maintained to the first pole at frequency F1. At frequency F1 the gain is reduced at a rate of 20 db per octave toward frequency F2 where it attains a gain of G1. The response thereafter stays constant at gain G1 as the frequency increases beyond the value F2. The gain is kept constant beyond frequency F2 in order to prevent instability in the closed loop system. In one specie of the present invention, the sampling frequency, that is, the frequency of the signal DRS, was 250 kilohertz. A pole was chosen at 300 Hertz at frequency F1 because the frequency band of interest was less than 300 Hertz. A zero was chosen at frequency F2 having a value of 30,000 Hertz to aid in the stability of the analog to digital converter. As can be seen from the frequency response plot of FIG. 2, the filter provides more gain to the low frequency phase errors than to the high frequency phase errors. The difference in gain between the low frequencies and the high frequencies G2−G1 was about 40 decibels. This filter response, when combined with the complete phase decision filter reduces the high frequency phase error at the phase comparator 14 to enable better encoding of the reconstructed phase differences in the band of interest.

The low-pass filter 28 may be represented by H(s) where H(s)=Ga/(s+a) and where this representation of H(s) is a common method of presenting transfer functions in the "s" domain used with Laplace transforms. In this representation of the filter 28 G =0.99 and "a"=2×PI×30,000 radians per second. When the response of the phase decision filter is calculated from the arrangement to the signal flow FIG. 1 and the value of H(s) given, the response, DS2/DS1 is computed to be DS2/DS1=(s+2×PI×30,000)/(s+2×PI×300). The response is identical to the phase decision filter response depicted in FIG. 2. This response provides a low-pass filter function with a pole at 300 Hertz and a zero at 30,000 Hertz according stability in the analog-to-digital converter.

Figure 3:
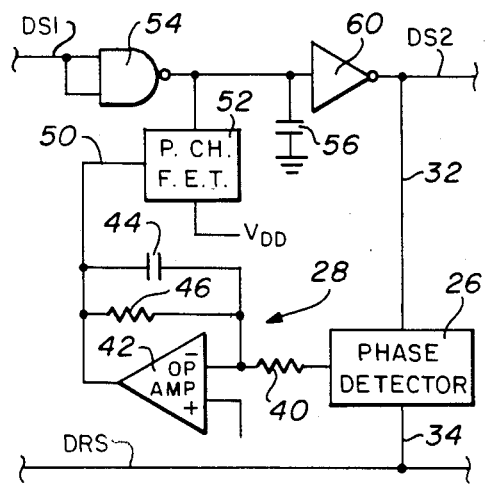
FIG. 3 is a circuit schematic of the decision filter illustrated in FIG. 1.

Referring now to FIG. 3, there is illustrated a circuit diagram depicting one mode of implementing the phase decision filter 13 of FIG. 1. The circuit includes the phase detector 26 having a first input to which the signal DS2 is applied by way of conductor 32 and a second input to which is applied the reference signal DRS by way of conductor 34. The phase detector output is a digital signal whose pulse width varies as a function of the phase difference between the digital reference signal DRS and the phase shifted digital signal DS2. The variation in pulse width of the output of phase detector 26 may be treated as an analog voltage in that the energy in each pulse is treated as an analog function. The output of phase detector 26 is fed by way of resistor 40 to an operational amplifier 42 and these elements, in conjunction with the parallel connected capacitor 44 and resistor 46 comprise the low-pass filter 28. The gain of the low-pass filter is set by the ratio of resistor 46 to resistor 40 and the filter cut-off frequency is set by the time constant established by the values of resistor 46 and capacitor 44. The output of operational amplifier 42 is an analog voltage that varies primarily as a function of the low-frequency component of the phase error. This output is applied by way of conductor 50 to the gate of a P channel field effect transistor 52 and thus controls or varies the current through the field effect transistor as a function of the output of the operational amplifier 42.

The field effect transistor 52 functions as a pullup to an open drain gate 54 which may be of the 74HC03 type. When the output of gate 54 is low, the voltage at the gate 54 is clamped to zero volts and when the gate is released, the time it takes for the positive going edge of the pulse to rise back to the value VDD will be a function of the voltage at the gate of the field effect transistor 52 and capacitor 56. Presented is a charging circuit that causes the voltage at the output of open drain gate 54 to increase toward or even up to the value of VDD and the time it takes for that voltage to arrive at a predetermined value effects a phase shift in the signal DS1, the magnitude of the shift being proportional to the voltage applied to the gate of the field effect transistor 52. When the voltage at the output of the field effect transistor 52 attains the switching threshhold voltage of inverter gate 60, which may be of the 74HCU04 type, the output of the gate will flip from a high value to a low value to create a negative going edge for the digital signal DS2 whose phase has been modulated principally dependent upon the value of the low frequency component of the phase error.

Whether the phase of the negative edge of the signal DS2 is shifted forward or back, that is either advanced or delayed, is a function of the relative occurrence of the digital signals DRS and DS2 appearing at the phase detector 26. The phase decision filter 13 may be adjusted so as to introduce a fixed delay when both the signals DRS and DS2 are in phase. Thereafter, any delay less than the predetermined value will effectively cause an advance in the phase of the signal DS2 whereas a delay above the predetermined value will effect a delay in the phase of the signal DS2. In summary, the circuit of FIG. 3 implements a method of measuring with a phase detector the phase error and thereafter filtering and amplifying the low frequency component of the phase error to cause a variation in the propagation delay of the negative going edge of the phase shifted signal DS1 which, when inverted at gate 54, becomes a positive going edge at the drain of the field effect transistor 52 and then becomes the negative going edge of DS2 at the output of inverter gate 60. The occurrence of the negative going edge of signal DS2 is compared with the reference signal DRS at the phase comparator 14 (FIG. 1).

Figure 4:
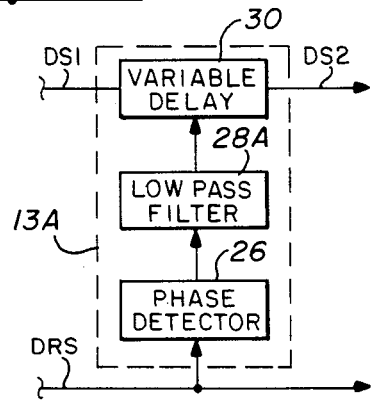
FIG. 4 is a block schematic of another specie of a phase decision filter embodying the present invention.

Another specie of the phase decision filter is illustrated in FIG. 4 as phase decision filter 13A. The overall gain and frequency response of the phase decision filter 13A is the same as that of the phase decision filter 13 of FIG. 1. In FIG. 4, phase detector has as its inputs digital signals DS1 and DRS. The output of the phase detector 26 is applied to a low-pass filter 28A which is represented by the function H(s) where H(s)=Ga/(s+a). In this representation of the low-pass filter 50 "G"=99 and "a"=2×PI×300 radians per second. When the response of the phase decision filter 13A is calculated and the value of H(s) given, the response, DS2/DS1 is computed to be DS2/DS1=(s+2×PI×30,000)/(s+2×PI×30,000). The response is identical to the phase decision filter response depicted in FIG. 1. This response provides a low-pass filter function with a pole at 300 Hertz and a zero at 30,000 Hertz provides stability in the analog-to-digital converter.

Figure 5:
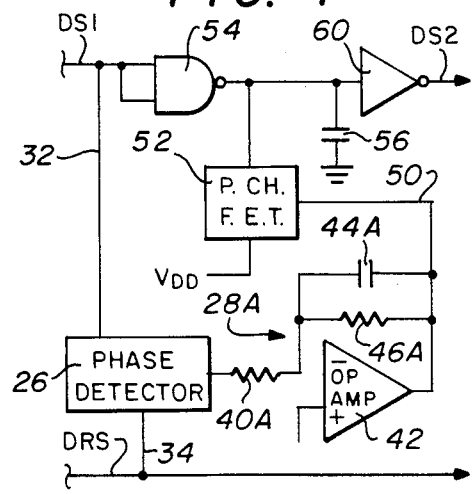
FIG. 5 is a circuit diagram of the phase decision filter of FIG. 4.

FIG. 5 is a circuit diagram depicting the phase decision filter 13A of FIG. 4. The phase error between DRS and DS1 is converted into a voltage by the phase detector 26 which as stated before can be one of a variety of circuits well known in the art. The analog correction voltage representative of the phase error is filtered by the RC low-pass filter 28A which has a pole at 300 Hertz. Resistor 46A and capacitor 46A set the time constant for the low-pass filter 28A and resistor 40A combined with resistor 46A set the gain of filter. Except for gain, this decision filter 13A has the same response as H(s) described in FIG. 3. The gain, G, is the sum of the gains of the phase detector 26, the low-pass filter 28A, and the variable delay 30. The filter output is applied to the gate of a P-channel field effect transistor 52 to modulate the transistor's channel resistance. The transistor is chosen for suitable gain and nominal channel resistance. By serving as the pull-up resistor for the open drain transistor in the output of the NAND gate 54, the P-channel transistor 52 becomes the variable resistance of the time delay RC network formed with capacitor 56. Therefore, the analog correction voltage representative of the phase error phase modulates, by modulating the P-channel transistor's channel resistance, the digital signal propagating from the gate 54 to the gate 60. Gate 54 may be of the 74HC03 type, while gate 60 may be of the 74HCU04 type.

Now that the invention has been described, variations and modifications will become apparent to those skilled in the art. It is intended that such variations and modifications be encompassed within the scope of the appended claims.

What is claimed is:

1. The method of generating a digital representation of an analog condition comprising the steps of:
   generating with two means, each independent of the other, two high-frequency digital pulse signals the frequencies of which are harmonically related one to the other;
   applying a representation of the analog condition to at least one of said means to cause a shift in phase in at least one of the digital signals to cause phase differences between said digital pulse signals;
   said phase differences including quantizing errors having energy from D.C. to one half the frequency of said digital signals;
   detecting said phase differences;
   filtering said detected phase differences with a low pass filter to produce a signal representative of phase error in a frequency band of interest;
   phase modulating one of said digital signals in response to said signal representative of phase error to enhance the phase difference in said frequency band of interest;
   comparing the phase modulated digital signal with the other digital signal to obtain a measure of the phase shift; said signals being compared being of constant frequency;
   utilizing the measure of the phase shift to adjust the phase of the digital pulse signals toward an in-phase condition; and
   generating a digital function representative of the amplitude of the adjustment utilized to return said digital signals toward the in-phase condition.

2. The method of claim 1 in which the phase shifted signal is phase modulated.

3. The method of claim 2 in which one of said high frequency digital pulse signals is a reference signal, and in which the detection of phase differences is conducted upon said reference signal and said phase shifted signal prior to the phase modulation of said phase shifted signal.

4. The method of claim 2 in which one of said high frequency digital pulse signals is a reference signal, and in which the detection of phase differences is conducted upon said reference signal and said phase shifted signal subsequent to the phase modulation of said phase shifted signal.

5. The method of claim 2 in which the detected phase difference is amplified at one level over the frequency band of interest and amplified at a lesser level beyond the frequency band of interest.

6. A system with improved signal-to-noise ratio for digitizing a representation of an analog condition comprising:
- two means for generating high frequency digital pulse signals, the frequencies of which are harmonically related one to the other, each said means comprising an oscillator;
- means for applying a representation of the analog condition to at least one of said means to cause a shift in phase in at least one of the digital signals to cause phase differences between said digital pulse signals, said phase differences including quantizing errors having energy from D.C. to one half the frequency of said digital signals;
- means for detecting said phase differences;
- means including a low-pass filter for filtering said detected phase differences to produce a signal representative of phase error in a frequency band of interest;
- means for phase modulating one of said digital signals in response to said signal representative of phase error to enhance the phase difference in said frequency band of interest;
- means for comparing the phase modulated digital signal with the other digital signal to obtain a measure of the phase shift; said signals being compared being of constant frequency;
- means for utilizing the measure of the phase shift to adjust the phase of the digital pulse signals toward an in-phase condition; and
- means for generating a digital function representative of the amplitude of the adjustment utilized to return said digital signals toward the in-phase condition.

7. The system of claim 6 in which said phase modulator means modulates said phase shifted signal.

8. The system of claim 6 in which said low pass filter includes an operational amplifer having a fixed gain over the frequency band of interest.

9. The system of claim 8 in which said operational amplifier has a fixed gain beyond the frequency band of interest and in which the gain over the frequency band of interest is higher than the gain beyond the frequency band of interest.

10. Means for reducing the effect of quantizing error in an analog-to-digital converter of the type comprising:
- two means for generating high frequency digital pulse signals, the frequencies of which are harmonically related one to the other, each said means comprising an oscillator;
- means for applying a representation of the analog condition to at least one of said means to cause a shift in phase in at least one of the digital signals to cause phase differences between said digital pulse signals, said phase differences including quantizing errors having energy from D.C. to one half the frequency of said digital signals;
- means for measuring the phase shift between said high frequency digital pulse signals, said signals being compared being of constant frequency;
- means for utilizing the measure of the phase shift to adjust the phase of the digital pulse signals toward an in-phase condition; and
- means for generating a digital function representative of the amplitude of the adjustment utilized to return said digital signals toward the in-phase condition;
- said means for reducing quantizing error comprising means for detecting said phase differences;
- means including a low-pass filter for filtering said detected phase differences to produce a signal representative of phase error in a frequency band of interest; and
- means for phase modulating one of said digital signals in response to said signal representative of phase error to enhance the phase difference in said frequency band of interest.

11. The system of claim 10 in which said phase modulator means modulates said phase shifted signal.

12. The system of claim 10 in which said low pass filter includes an operational amplifer having a fixed gain over the frequency band of interest.

13. The system of claim 12 in which said operational amplifier has a fixed gain beyond the frequency band of interest and in which the gain over the frequency band of interest is higher than the gain beyond the frequency band of interest.

* * * * *

UNITED STATES PATENT AND TRADEMARK OFFICE
CERTIFICATE OF CORRECTION

PATENT NO. : 4,754,260

DATED : June 28, 1988

INVENTOR(S) : Robert G. Nelson et al

It is certified that error appears in the above-identified patent and that said Letters Patent is hereby corrected as shown below:

In column 7, line 55, change "30,000" (second occurrence) to -- 300 --.

Signed and Sealed this

Eighth Day of November, 1988

Attest:

DONALD J. QUIGG

Attesting Officer

Commissioner of Patents and Trademarks